(12) United States Patent
Kato

(10) Patent No.: US 8,558,387 B2
(45) Date of Patent: Oct. 15, 2013

(54) SEMICONDUCTOR DEVICE INCLUDING BOTTOM SURFACE WIRING AND MANFACTURING METHOD OF THE SEMICONDUCTOR DEVICE

(75) Inventor: Osamu Kato, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 254 days.

(21) Appl. No.: 12/926,178

(22) Filed: Oct. 29, 2010

(65) Prior Publication Data

US 2011/0101539 A1   May 5, 2011

(30) Foreign Application Priority Data

Oct. 30, 2009   (JP) ................. 2009-250749

(51) Int. Cl.
*H01L 23/48* (2006.01)
*H01L 23/52* (2006.01)
*H01L 29/40* (2006.01)

(52) U.S. Cl.
USPC ..... 257/774; 257/775; 257/777; 257/E23.011

(58) Field of Classification Search
USPC ................... 257/728, 777, 774, 775, E23.011
See application file for complete search history.

(56) References Cited

U.S. PATENT DOCUMENTS

2008/0113502 A1\*   5/2008   Low et al. ..................... 438/612
2009/0309235 A1\*   12/2009   Suthiwongsunthorn et al. ............................. 257/777

FOREIGN PATENT DOCUMENTS

JP   2006-128353 A   5/2006

\* cited by examiner

*Primary Examiner* — Phat X Cao
(74) *Attorney, Agent, or Firm* — Rabin & Berdo, P.C.

(57) ABSTRACT

Disclosed herein is a semiconductor device including a semiconductor substrate, a wiring layer formed above the semiconductor substrate, a through-hole electrode extending from the bottom surface of the semiconductor substrate to the wiring layer, a bottom surface wiring provided at the bottom surface of the semiconductor substrate such that the bottom surface wiring is connected to the through-hole electrode, and an external terminal connected to the bottom surface wiring. The bottom surface wiring has a greater film thickness than a film thickness of the through-hole electrode at least a portion of the bottom surface wiring including a connection part between the bottom surface wiring and the external terminal.

17 Claims, 13 Drawing Sheets

SEMICONDUCTOR DEVICE INCLUDING BOTTOM SURFACE WIRING AND MANFACTURING METHOD OF THE SEMICONDUCTOR DEVICE

BACKGROUND OF THE INVENTION

1. Field of the Invention

The present invention relates to a semiconductor device, and, more particularly, to a semiconductor device having a through-hole electrode such as a through-silicon-via (TSV) extending through a semiconductor layer.

2. Description of the Related Art

In a field of information equipment, such as a mobile phone with a camera and a digital camera, miniaturization, integration density, and functionality have all been dramatically improved in recent years. A wafer-level-chip size-package (hereinafter, referred to as a W-CSP), i.e., a package having the same size as a chip, is well-known technology for reducing the size of an image sensor, such as a charge coupled device (CCD) or a Complementary metal oxide semiconductor (CMOS), mounted in such information equipment. W-CSP employs a new package concept in which all fabrication processes are completed in a wafer state. In the same manner as a fine-pitch-ball-grid-array (FBGA), W-CSP is based on an external shape in which terminals are arranged at the bottom surface of the package in the form of, for example, a grid. The size of the package is approximately equal to the size of a chip.

In an image sensor configured in such a W-CSP structure, a through-hole electrode structure such as a through-silicon-via (TSV) structure is adopted so as to improve reliability of a device and to reduce the size of the device. Generally, an electrode, which transmits and receives a signal to and from the outside, of a semiconductor device is formed at the same surface as a circuit element forming surface. In the a through-hole electrode structure, on the other hand, a through hole is formed through a chip from the bottom surface of the chip in the thickness direction of the chip using micro processing technology, a conductive film is formed at the inner wall of the through hole, and the conductive film is connected to a top surface electrode. Consequently, it is possible to achieve input and output of signals at the bottom surface of the chip, which is not generally used. Also, it is possible to stack a plurality of chips using a through-hole electrode technology and to form a signal transmission channel in the stacking direction. As a result, it is possible to reduce a wiring distance, to achieve high-speed operation and high reliability, and to dramatically improve packaging density, as compared with a conventional wiring structure.

FIG. 1 is a view showing the construction of a conventional semiconductor device having a through-hole electrode. Circuit elements 101, such as transistors, are formed at the top surface of a semiconductor substrate 100. An interlayer insulating film 110 is formed on the semiconductor substrate 100. An interlayer insulating film 110 isolates wiring layers 111a and 111b from each other. The lower wiring layer 111a is connected to the upper wiring layer 111b via contact vias 112. An opening is provided in an uppermost interlayer insulating film 110. A top surface electrode 113 is connected to the wiring layer 111b exposed through the opening of the interlayer insulating film 110. A through-hole electrode 130 extends through the semiconductor substrate 100 and the interlayer insulating film 110 such that the through-hole electrode 130 is electrically connected to the wiring layer 111a. A bottom surface wiring 140 is provided on the bottom surface of the semiconductor substrate 100 such that the bottom surface wiring 140 is continuously and integrally formed with the through-hole electrode 130. The bottom surface of the semiconductor substrate 100 is covered with a insulating film 160, such as a solder resist. An opening is provided in the insulating film 160. An external terminal 150 is connected to an exposed portion of the bottom surface wiring 140. The external terminal 150 is electrically connected to the top surface electrode 113 via the bottom surface wiring 140 and the through-hole electrode 130.

The through-hole electrode 130 and the bottom surface wiring 140 are formed, for example, in the following sequence. First, a semiconductor substrate 100 having circuit elements 101 formed thereon is etched from the bottom surface of the semiconductor substrate 100 so as to form a through hole extending to a wiring layer 111a through the semiconductor substrate 100 and an interlayer insulating film 110. Next, a insulating film 120 is formed to cover the inner wall of the through hole, and then only the insulating film 120 formed at the bottom of the through hole is removed to expose the wiring layer 111a at the bottom of the through hole. Next, a barrier layer and a plating seed layer are sequentially formed to cover the side and the bottom of the through hole and the bottom surface of the semiconductor substrate 100. Next, a conductive film made of, for example, Cu is formed to cover the inner wall of the through hole and the bottom surface of the semiconductor substrate 100 using an electroplating method. Subsequently, predetermined patterning is carried out with respect to the conductive film at the bottom surface of the semiconductor substrate 100 so as to form a through-hole electrode 130 and a bottom surface wiring 140. Meanwhile, the inner space of the through hole is filled with a insulating film 160.

A Japanese Patent Application Publication No. 2006-128353 discloses a construction of a semiconductor device having a through-hole electrode.

As described above, the through-hole electrode 130 is integrally formed with the bottom surface wiring 140. The conductive film constituting the through-hole electrode 130 and the conductive film constituting the bottom surface wiring 140 are formed in a single process. For this reason, it is not possible to independently control the film thickness of the conductive film constituting the through-hole electrode 130 and the film thickness of the conductive film constituting the bottom surface wiring 140. As a result, there arise the following problems. That is, if the film thickness of the through-hole electrode which covers the inner wall of the through hole is too large, the conductive film constituting the through-hole electrode is deformed due to thermal stress generated by heat treatment during forming of the film and during forming of an external terminal after forming the film, with the result that the through-hole electrode may be separated from the inner wall of the through hole. The thermal stress is believed to be generated due to a difference of thermal expansion coefficient between the insulating film 160 in the interior of the through-hole electrode 130 and the conductive film constituting the through-hole electrode 130. Consequently, it is not preferable to increase the film thickness of the through-hole electrode such that the film thickness of the through-hole electrode exceeds a predetermined limit due to low durability and low reliability.

On the other hand, the external terminal 150 is connected to the bottom surface wiring 140. In a case in which the bottom surface wiring 140 is made of, for example, Cu, and the external terminal 150 is made of, for example, SnAg, Cu of the bottom surface wiring 140 may melt into Sn of the external terminal 150 during a reflow process carried out when the semiconductor device is mounted on a mounting substrate, with the result that a void may be generated, and therefore, the bottom surface wiring 140 may be separated from the bottom surface of the semiconductor substrate 100. In a conventional manufacturing method, the film thickness of the bottom surface wiring 140 is restricted if the film thickness of the through-hole electrode 130 is restricted. In a case in which the film thickness of the bottom surface wiring 140 is small, therefore, most of the bottom surface wiring 140 may be eroded by an alloy layer, with the result that a possibility of separation of the bottom surface wiring 140 is further increased. Consequently, it is preferable for the bottom surface wiring 140 to have a sufficient film thickness at least a connection potion with the external terminal 150. Meanwhile, mutual diffusion between the bottom surface wiring 140 and the external terminal 150 may occur in a combination of Cu and SnPb, Cu and AuSn, or Al and Au in addition to a combination of Cu and SnAg as described above.

In the conventional manufacturing method as described above, the through-hole electrode 130 and the bottom surface wiring 140 are continuously and integrally formed with each other, and the through-hole electrode 130 and the bottom surface wiring 140 are formed in a single process, with the result that the film thickness of one of the through-hole electrode 130 and the bottom surface wiring 140 affects the film thickness of the other. In a case in which the film thickness of the through-hole electrode 130 is too large, therefore, separation of the through-hole electrode 130 may occur. Also, in a case in which the film thickness of the bottom surface wiring 140 is too small, separation of the bottom surface wiring 140 may occur. In the conventional manufacturing method, it is difficult to avoid these problems simultaneously.

SUMMARY OF THE INVENTION

The present invention has been made in view of the above problems, and it is an object of the present invention to provide a semiconductor device and a manufacturing method of the same which can simultaneously prevent separation of the through-hole electrode and separation of the bottom surface wiring.

In accordance with an aspect of the present invention, the above and other objects can be accomplished by the provision of a semiconductor device including a semiconductor substrate, a wiring layer, including at least one layer, formed above the semiconductor substrate, a through-hole electrode extending from the bottom surface of the semiconductor substrate to the wiring layer, a bottom surface wiring provided at the bottom surface of the semiconductor substrate such that the bottom surface wiring is connected to the through-hole electrode, and an external terminal connected to the bottom surface wiring, wherein the bottom surface wiring has a greater film thickness than a film thickness of the through-hole electrode at least a portion of the bottom surface wiring including a connection part between the bottom surface wiring and the external terminal.

In accordance with another aspect of the present invention, there is provided a manufacturing method of a semiconductor device including the steps of forming a wiring layer above a semiconductor substrate, forming a through hole extending from the bottom surface of the semiconductor substrate to the wiring layer, forming a insulating film to cover the side and the bottom of the through hole and the bottom surface of the semiconductor substrate, partially removing the insulating film to expose the wiring layer at the bottom of the through hole, forming a conductive film to cover the bottom surface of the semiconductor substrate and the side and the bottom of the through hole so as to form a through-hole electrode extending from the bottom surface of the semiconductor substrate to the wiring layer and, at the same time, forming a bottom surface wiring on the bottom surface of the semiconductor substrate such that the bottom surface wiring is connected to the through-hole electrode, forming a conductive film to further cover a portion of the bottom surface wiring so as to form a thick film part of the bottom surface wiring, and forming an external terminal on the thick film part of the bottom surface wiring.

In accordance with another aspect of the present invention, there is provided a manufacturing method of a semiconductor device including the steps of forming a wiring layer above a semiconductor substrate, forming a first insulating film at the bottom surface of the semiconductor substrate, forming a first conductive film on the first insulating film, forming a through hole extending from the first conductive film to the wiring layer, forming a second insulating film to cover an inner side and an inner bottom of the through hole and the first conductive film, partially removing the second insulating film to expose the wiring layer at the bottom of the through hole and to expose a portion of the first conductive film at the bottom surface of the semiconductor substrate, forming a second conductive film to cover the inner side and the inner bottom of the through hole and the second insulating film so as to form a through-hole electrode extending from the bottom surface of the semiconductor substrate to the wiring layer and to form a bottom surface wire, constituted by the first and second conductive films, on the bottom surface of the semiconductor substrate such that a portion of the second conductive film is connected to the first conductive film, and forming an external terminal at a portion of the bottom surface wire corresponding to a connection part between the first conductive film and the second conductive film.

In accordance with yet another aspect of the present invention, there is provided a manufacturing method of a semiconductor device including the steps of forming a wiring layer above a semiconductor substrate, forming a through hole extending from the bottom surface of the semiconductor substrate to the wiring layer, forming a insulating film to cover an inner side and an inner bottom of the through hole and the bottom surface of the semiconductor substrate, partially removing the insulating film to expose the wiring layer at the bottom of the through hole, forming a first conductive film on the bottom surface of the semiconductor substrate, forming a second conductive film to cover the inner side and the inner bottom of the through hole and the first conductive film so as to form a through-hole electrode extending from the bottom surface of the semiconductor substrate to the wiring layer and to form a bottom surface wire, comprising the first and second conductive films, on the bottom surface of the semiconductor substrate such that the bottom surface wire is connected to the through-hole electrode, and forming an external terminal on the bottom surface wire.

In the semiconductor device according to the present invention, the film thickness of the bottom surface wiring may be sufficiently secured such that separation of the bottom surface wiring due to metal diffusion between the bottom surface wiring and the external terminal does not occur even in a case in which the film thickness of the through-hole electrode is restricted such that separation of the through-hole electrode due to thermal stress does not occur. Consequently, it is possible to simultaneously prevent separation of the through-hole electrode and separation of the bottom surface wiring.

DETAILED DESCRIPTION OF THE INVENTION

Hereinafter, embodiments of the present invention will be described in detail with reference to the accompanying drawings. Meanwhile, the same reference numbers will be used throughout the drawings to refer to the same or equivalent.

First Embodiment

Figure 1:
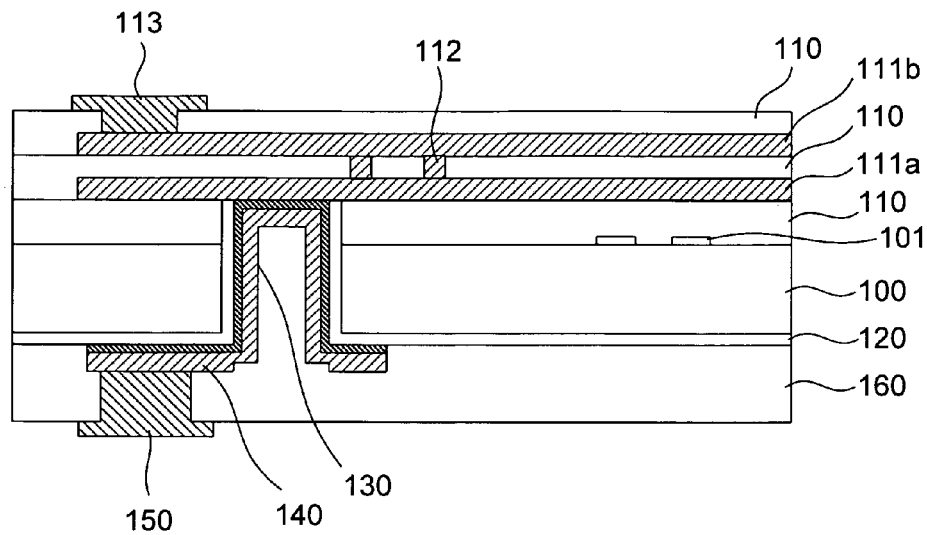
FIG. 1 is a cross-sectional view showing the construction of a conventional semiconductor device having a through-hole electrode.
Figure 2:
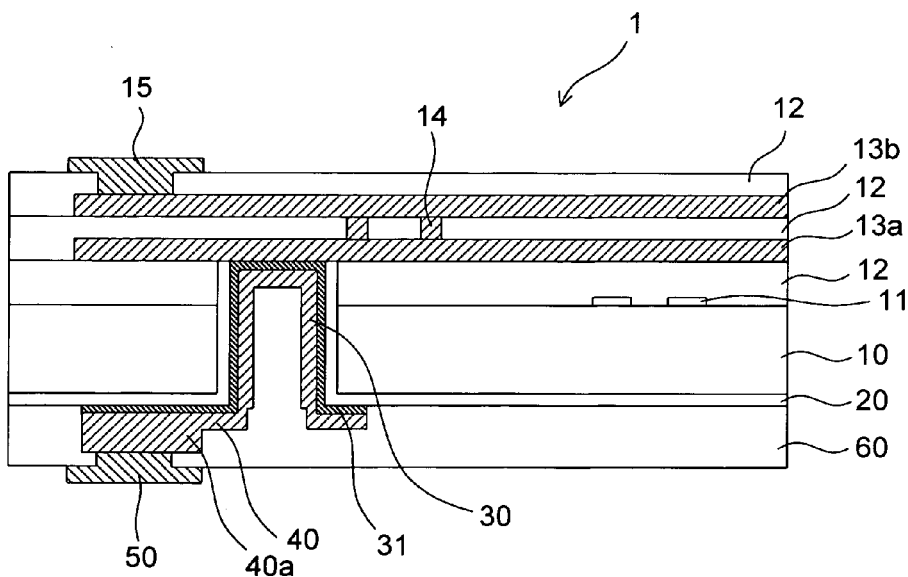
FIG. 2 is a cross-sectional view showing the construction of a semiconductor device according to a first embodiment of the present invention.

FIG. 2 is a cross-sectional view showing the structure of a semiconductor device 1 according to a first embodiment of the present invention. Specifically, FIG. 2 shows a through-hole electrode forming part of the semiconductor device 1. The semiconductor device 1 constitutes, for example, an image sensor. A semiconductor substrate 10, made of, for example, a silicon single crystal, constitutes a main body of the image sensor. Light receiving elements, such as photo diodes, and circuit elements 11, such as complementary metal oxide semiconductor (CMOS) circuits are formed at the top surface of the semiconductor substrate 10. A plurality of light receiving elements, the number of which corresponds to the number of pixels, are formed on the semiconductor substrate 10. Light emitted from an image pickup target is focused on light receiving surfaces of the respective light receiving elements by an external optical system, such as a lens. Each of the light receiving element outputs a photoelectric conversion signal corresponding to an intensity of the light received by the light receiving element as a detection output signal. Also, image data are created on the basis of the positions and the detection output signals of the respective light receiving elements.

Wiring layers 13a and 13b which are isolated from each other by an interlayer insulating film 12 are formed on the semiconductor substrate 10. The wiring layers 13a and 13b are made of, for example, aluminum (Al). The wiring layers 13a and 13b are connected to each other via contact plugs 14. An opening is provided in an uppermost interlayer insulating film 12. A top surface electrode 15 is connected to a portion, exposed through the opening, of the wiring layer 13b. The top surface electrode 15 is made of, for example, aluminum. The top surface electrode 15 constitutes a connection terminal through which the semiconductor device transmits and receives a signal to and from another semiconductor device.

A through-hole electrode 30 such as a through-silicon-via (TSV) extends from the bottom surface of the semiconductor substrate 10 to the wiring layer 13a through the semiconductor substrate 10 and the interlayer insulating film 12. The through-hole electrode 30 is formed by forming a cylindrical through hole formed through the semiconductor substrate 10 and the interlayer insulating film 12, forming a barrier metal 31, which is made of Ti, TaN, or TiN, and a plating seed layer, which is made of Cu on an inner wall of the cylindrical through hole and forming a conductive film, which is made of Cu, on the plating seed layer using an electroplating method. The through-hole electrode 30 has a film thickness (for example, 2 to 4 μm) with which the through-hole electrode is not affected by thermal stress. A plurality of through-hole electrodes 30 may be provided, for example, along the edge of the semiconductor device 1.

A bottom surface wiring 40 which is continuously and integrally formed with the through-hole electrode 30 is provided at the bottom surface of the semiconductor substrate 10. The bottom surface wiring 40 is made of the same material as the through-hole electrode 30. The bottom surface wiring 40 is electrically connected to the through-hole electrode 30. The bottom surface wiring 40 is a conductor wire interconnecting the through-hole electrode 30 and an external terminal 50 on the bottom surface of the semiconductor substrate 10. The bottom surface wiring 40 is arbitrarily patterned. Between the through-hole electrode 30 and the semiconductor substrate and between the bottom surface wiring 40 and the semiconductor substrate 10 is provided a insulating film 20, having a film thickness of 1 to 3 μm, made of a silicon oxide film ($SiO_2$) or a silicon nitride film ($Si_2N_4$) so as to electrically isolate the through-hole electrode 30 and the bottom surface wiring 40 from the semiconductor substrate 10. The bottom surface of the semiconductor substrate 10 is covered with a insulating film 60, such as a solder resist. An opening is provided in the insulating film 60. The external terminal 50 is connected to a portion, exposed through the opening, of the bottom surface wiring 40. The external terminal 50 is made of, for example, SnAg, SnAgCu, SnCu, SnZn, SnPb, AuSn, or the like. The external terminal 50 may be formed in the shape of a solder ball. A plurality of external terminals 50 are provided so as to correspond to the respective through-hole electrodes 30. The external terminals 50 may be arranged on the bottom surface of the semiconductor substrate 10 in the form of a grid. The insulating film 60 prevents solder from leaking to the bottom surface wiring during a reflow process carried out when the semiconductor device 1 is mounted on a mounting substrate. The external terminal 50 is electrically connected to the top surface electrode 15 via the bottom surface wiring 40 and the through-hole electrode 30. Consequently, it is possible to achieve transmission and reception of input and output signals at the bottom surface of the semiconductor substrate 10.

The bottom surface wiring 40 has a thick film part 40a formed at least a portion, to which the external terminal 50 is connected, of the bottom surface wiring 40. The thick film part 40a of the bottom surface wiring 40 has a greater film thickness (for example, 7 μm) than other portions of the bottom surface wiring 40. Also, the film thickness of the thick film part 40a is greater than the film thickness of the through-hole electrode 30. Because the bottom surface wiring 40 has a large film thickness only immediately below the external terminal 50, it is possible to prevent separation of the bottom surface wiring 40 even when metal (for example, Cu) constituting the bottom surface wiring and metal (for example, SnAg) constituting the external terminal 50 are diffused to each other. A region where the thick film part 40a is formed is limited to a portion where the bottom surface wiring 40 is connected to the external terminal 50. It is possible to control the film thickness of the thick film part 40a independently of the film thickness of the through-hole electrode 30. Also, it is possible to set the film thickness of the through-hole electrode 30 independently of the film thickness of the bottom surface wiring 40. The film thickness of the through-hole electrode 30 is set such that separation of the through-hole electrode 30 due to thermal stress does not occur. In the structure of the semiconductor device 1 according to the first embodiment, the film thickness of the through-hole electrode is different from the film thickness of the bottom surface wiring. That is, while the film thickness of the through-hole electrode is restricted, the film thickness of the bottom surface wiring is increased. Consequently, it is possible to simultaneously prevent separation of the through-hole electrode and separation of the bottom surface wiring.

Next, a manufacturing method of the semiconductor device 1 configured in the above-described structure will be described. FIGS. 3A to 5C are cross-sectional views respectively showing process steps of a manufacturing method of the semiconductor device 1 according to the first embodiment of the present invention.

Figure 3A:
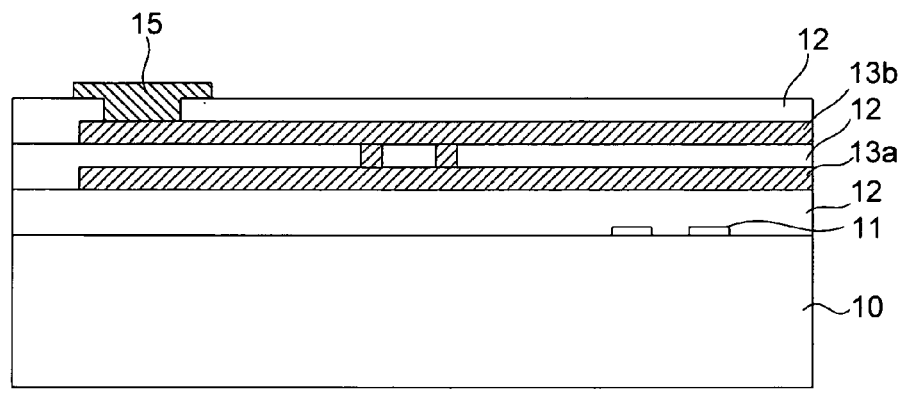
FIGS. 3A to 3C are cross-sectional views showing a manufacturing method of the semiconductor device according to the first embodiment of the present invention.

First, a well-known image sensor chip manufacturing method, including a circuit element forming process of forming circuit elements, such as CMOS circuits and light receiving elements, a wiring layer forming process, and a top surface electrode forming process, is carried out to prepare a semiconductor substrate 10 (FIG. 3A).

Figure 3B:
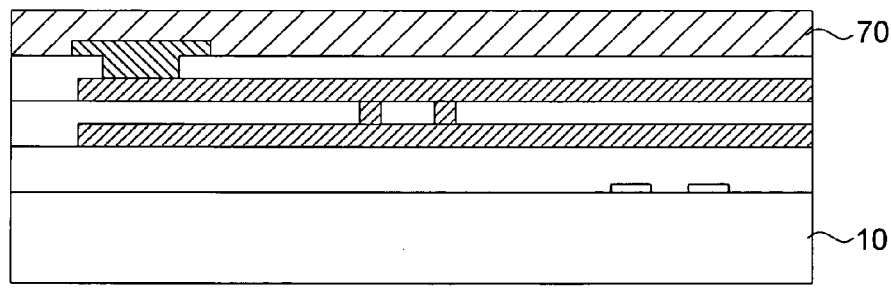

Subsequently, a support member 70, such as a transparent tape or a glass substrate, is joined to a circuit element forming surface (i.e. top surface) of the semiconductor substrate 10. Next, a grinding process using a grinder or a chemical mechanical polishing (CMP) process is carried out to grind the bottom surface of the semiconductor substrate 10 such that the semiconductor substrate 10 is processed to a thickness of, for example, approximately 100 μm (FIG. 3B).

Figure 3C:
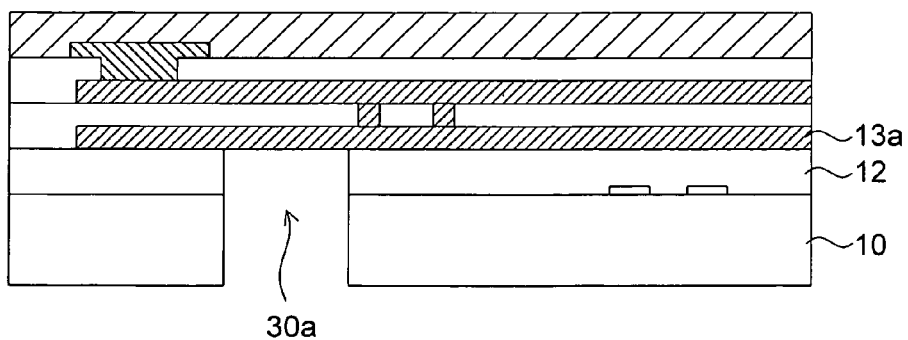

Next, a resist is applied to the bottom surface of the semiconductor substrate 10, and an exposure process and a development process are carried out to form a resist mask (not shown) having an opening formed at a region corresponding to a through-hole electrode forming part. Next, the semiconductor substrate 10 and an interlayer insulating film 12 are etched from the bottom surface of the semiconductor substrate 10 exposed through the opening of the resist mask, using a dry etching method, to form a cylindrical through hole 30a, having a diameter of 30 μm or more, extending to a wiring layer 13a (FIG. 3C).

Figure 4A:
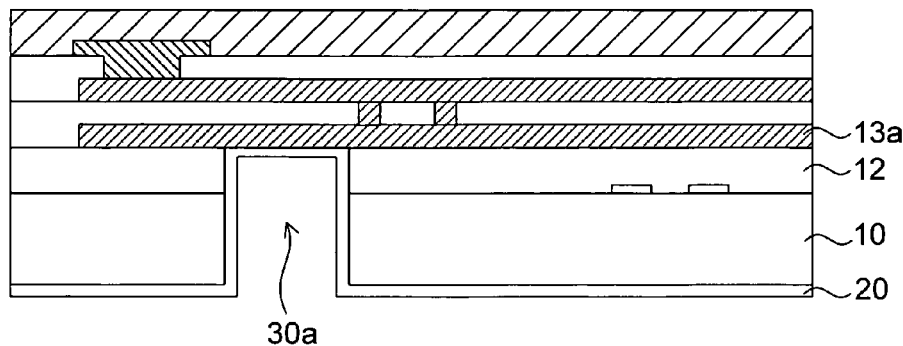
FIGS. 4A to 4C are cross-sectional views showing a manufacturing method of the semiconductor device according to the first embodiment of the present invention.

Next, an insulating film 20 made of, for example, a silicon oxide film ($SiO_2$), is formed to cover the inner side and the inner bottom of the through hole 30a and the bottom surface of the semiconductor substrate 10. The insulating film 20 may be formed through a chemical vapor deposition (CVD) method using a mixture of silane gas ($SiH_4$) and oxygen gas ($O_2$) as a raw material gas. Meanwhile, the material for the insulating film 20 is not limited to the silicon oxide film ($SiO_2$). For example, the insulating film 20 may be a silicon nitride film ($Si_3N_4$). In this case, a mixture of silane gas ($SiH_4$) and ammonia gas ($NH_3$) is used as a raw material gas (FIG. 4A).

Figure 4B:
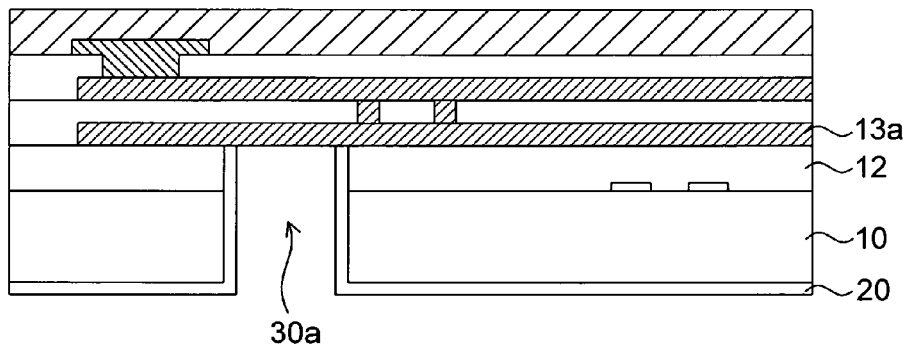

Next, a resist mask (not shown) having an opening, formed at a portion corresponding to a through hole forming part, is formed on the bottom surface of the semiconductor substrate 10. Subsequently, an anisotropic dry etching process is carried out through the resist mask to remove only the insulating film 20 formed at the bottom of the through hole 30a. As a result, the wiring layer 13a is exposed at the bottom of the through hole 30a. The insulating film 20 remains on the inner side of the through hole 30a and the bottom surface of the semiconductor substrate 10 (FIG. 4B).

Figure 4C:
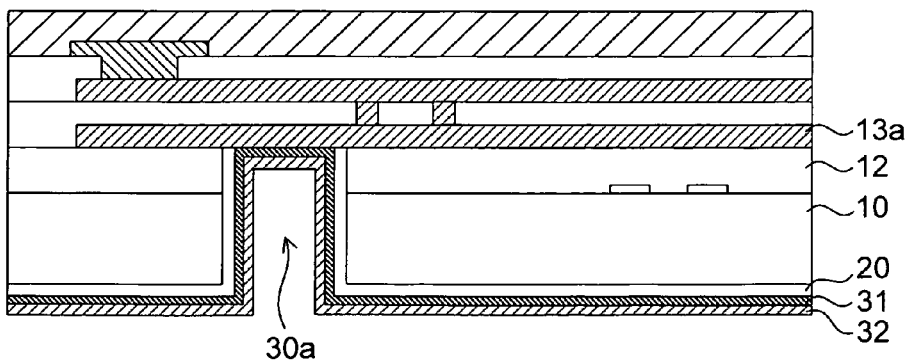

Next, a barrier metal 31 made of, for example Ti, TaN, or TiN, is formed to cover the inner side and the inner bottom of the through hole 30a and the bottom surface of the semiconductor substrate 10 using a collimated sputtering method or a CVD method exhibiting a high coverage property with respect to the interior of the through hole 30a. The barrier metal 31 prevents a material, Cu, for a through-hole electrode 30 and a bottom surface wiring 40 from being diffused into the semiconductor substrate 10. Next, a plating seed layer 32, made of Cu, having a film thickness of 1 μm or less is formed on the barrier metal 31 using a collimated sputtering method or a CVD method. The barrier metal 31 and the plating seed layer 32 are connected to the wiring layer 13a at the bottom of the through hole 30a (FIG. 4C).

Figure 5A:
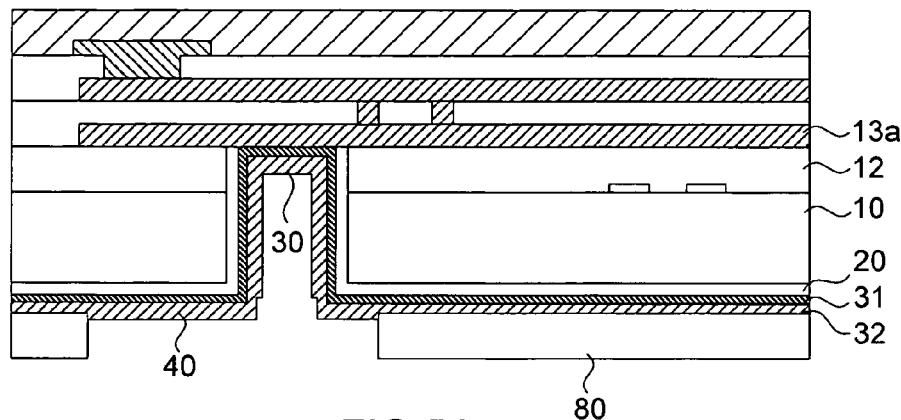
FIGS. 5A to 5C are cross-sectional views showing a manufacturing method of the semiconductor device according to the first embodiment of the present invention.

Next, a resist mask 80 corresponding to a pattern of a bottom surface wiring 40 is formed at the bottom surface of the semiconductor substrate 10. That is, the resist mask 80 has an opening formed at a portion corresponding to the through hole forming part and a bottom surface wiring forming part. Next, a conductive film, made of Cu, is formed on the plating seed layer 32 exposed through the opening of the resist mask 80 using an electroplating method. In the electroplating process, an electrode is attached to the plating seed layer 32, and the semiconductor substrate is deposited in a plating solution, whereby the conductive film is formed on the plating seed layer 32. As a result, a through-hole electrode 30 is formed to cover the inner side and the inner bottom of the through hole 30a, and a bottom surface wiring 40, connected to the through-hole electrode 30, is formed at the bottom surface of the semiconductor substrate 10. The conductive film has a film thickness (for example, 2 to 4 μm) with which separation of the through-hole electrode 30 due to thermal stress does not occur. Since the bottom surface wiring 40 is formed simultaneously with the through-hole electrode 30 through the plating process, the film thickness of the bottom surface wiring 40 is equal to the film thickness of the through-hole electrode 30 (FIG. 5A).

Figure 5B:
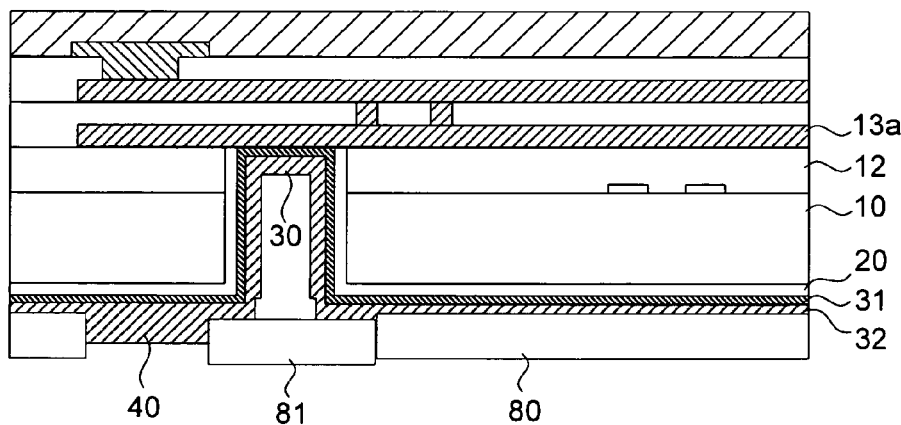

Next, a resist mask 81 is further formed on the bottom surface of the semiconductor substrate 10 without removal of the resist mask 80. The resist mask 81 has an opening formed at a region including a portion where the bottom surface wiring 40 is connected to an external terminal 50. The opening end of the through hole 30a is covered by the resist mask 81. Next, a conductive film, made of Cu, is further formed at a portion of the bottom surface wiring 40 exposed through the opening of the resist mask 81 using an electroplating method. As a result, a thick film part 40a having a greater film thickness than other portions of the bottom surface wiring 40 is formed in the opening of the resist mask 81. Through the plating process, which is carried out twice, the conductive film is formed such that the film thickness of the thick film part 40a is, for example, 7 μm or more (FIG. 5B).

Figure 5C:
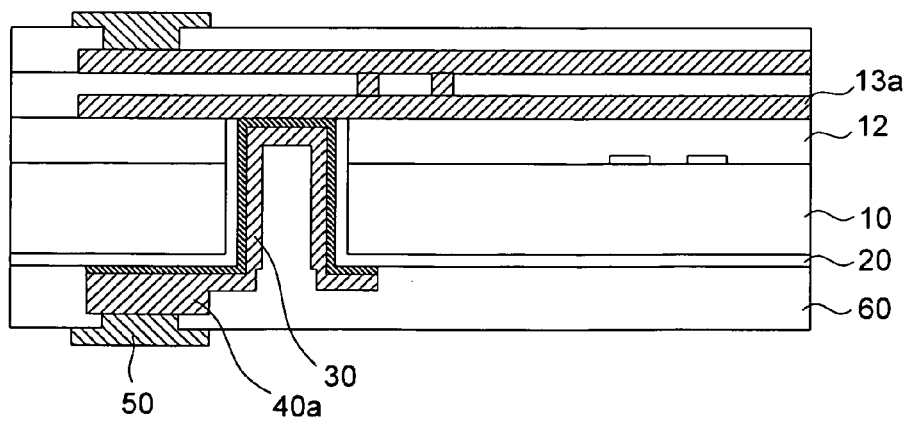

Next, the resist mask 80 and the resist mask 81 are removed, and the plating seed layer 32 and the barrier metal 31 are removed from a portion which does not constitute the bottom surface wiring 40 on the bottom surface of the semiconductor substrate 10 using a dry etching method or a wet etching method. Next, a photosensitive solder resist is applied to cover the bottom surface wiring 40. The photosensitive solder resist is selectively exposed and cured to form a insulating film having an opening formed at an external terminal forming part. The inner space of the through hole 30a is filled with the insulating film 60. The opening of the insulating film 60 is provided on the thick film part 40a of the bottom surface wiring 40. Next, flux is applied to the thick film part 40a of the bottom surface wiring 40 exposed through the opening of the insulating film 60. A solder ball, made of SnAg, is mounted on the thick film part 40a of the bottom surface wiring 40 using a mask, and a reflow process is carried out to form an external terminal 50 on the thick film part 40a. Meanwhile, the solder ball may be made of SnAgCu, SnCu, SnZn, SnPb, AuSn, or the like. After that, the support member 70 attached to the circuit element forming surface of the semiconductor substrate 10 is removed. A semiconductor device 1 is manufactured through the respective processes as described above. Meanwhile, the semiconductor device 1 may be cut into pieces using a dicing method, and the pieces of the semiconductor device 1 may be stacked, as needed (FIG. 5C).

In the semiconductor device according to the first embodiment and the manufacturing method of the same, as described above, the bottom surface wiring 40 is integrally formed with the through-hole electrode 30, and the thick film part 40a, having a greater film thickness than other portions of the bottom surface wiring 40, is formed at a portion, to which the external terminal 50 is joined, of the bottom surface wiring 40. Since the thick film part 40a is locally formed through an additional plating process, the film thickness of the through-hole electrode 30 is not affected by the thick film part 40a. That is, the film thickness of the through-hole electrode 30 is restricted such that separation of the through-hole electrode due to thermal stress does not occur. On the other hand, the film thickness of the bottom surface wiring 40 is sufficiently secured such that separation of the bottom surface wiring 40 due to metal diffusion between the bottom surface wiring 40 and the external terminal 50 does not occur. In brief, in the semiconductor device according to the first embodiment and the manufacturing method of the same, the film thickness of the through-hole electrode and the film thickness of the bottom surface wiring are controlled independently, and therefore, it is possible to simultaneously prevent separation of the through-hole electrode and separation of the bottom surface wiring. Also, in the manufacturing method according to the first embodiment, the thick film part 40a of the bottom surface wiring 40 is locally formed only at a portion where the film thickness needs to be secured, and therefore, it is possible to greatly restrain the cost increase due to the increase in exchange cycle of a plating solution or the increase in number of processes.

Second Embodiment

Figure 6:
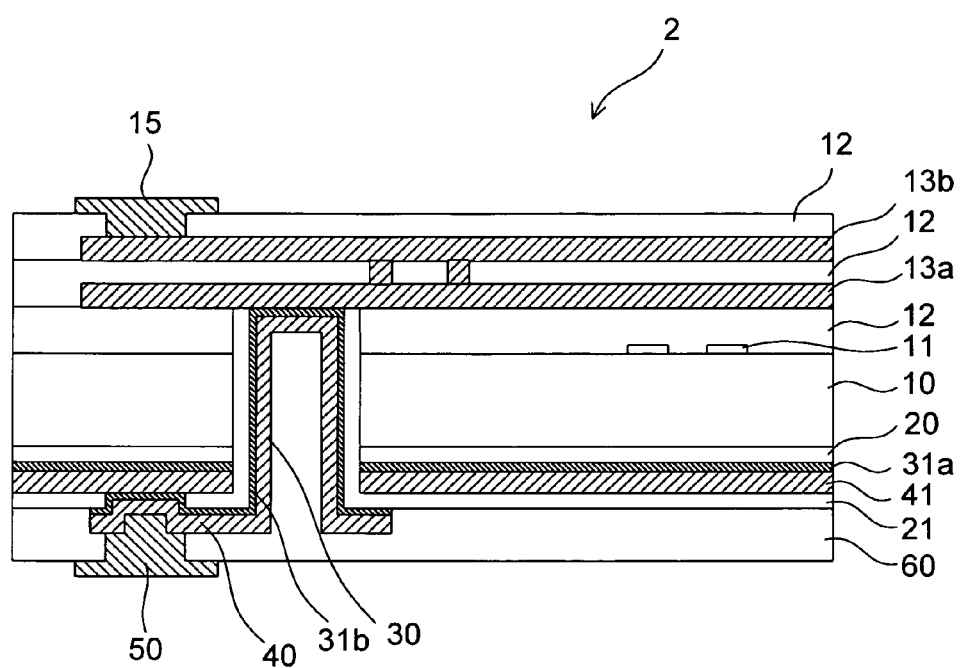
FIG. 6 is a cross-sectional view showing the construction of a semiconductor device according to a second embodiment of the present invention.

FIG. 6 is a cross-sectional view showing the structure of a semiconductor device 2 according to a second embodiment of the present invention. Specifically, FIG. 6 shows a through-hole electrode forming part of the semiconductor device 2. The semiconductor device 2 constitutes an image sensor in the same manner as the semiconductor device 1 according to the first embodiment.

Wiring layers 13a and 13b, which are isolated from each other by an interlayer insulating film 12, are formed on a semiconductor substrate 10. The wiring layers 13a and 13b are made of, for example, aluminum (Al). The wiring layers 13a and 13b are connected to each other via contact plugs 14. An opening is provided in an uppermost interlayer insulating film 12. A top surface electrode 15 is connected to a portion, exposed through the opening, of the wiring layer 13b. The top surface electrode 15 is made of, for example, aluminum. The top surface electrode 15 constitutes a connection terminal through which the semiconductor device transmits and receives a signal to and from another semiconductor device.

A through-hole electrode 30 such as a through-silicon-via (TSV) extends from the bottom surface of the semiconductor substrate 10 to the wiring layer 13a through insulating films 20 and 21, an underlying wire 41, the semiconductor substrate 10, and the interlayer insulating film 12. The through-hole electrode 30 is formed by forming a cylindrical through hole formed through the semiconductor substrate 10 and the interlayer insulating film 12, forming a barrier metal 31b, which is made of Ti, TaN, or TiN, and a plating seed layer, which is made of Cu, at an inner wall of the cylindrical through hole and forming a conductive film, which is made of Cu, on the plating seed layer using an electroplating method. The through-hole electrode 30 has a film thickness (for example, 2 to 4 μm) with which the through-hole electrode is not affected by thermal stress. A plurality of through-hole electrodes 30 may be provided, for example, along the edge of the semiconductor device 2.

The insulating film 20, a barrier metal 31a, the underlying wire 41, and the insulating film 21 are stacked on the bottom surface of the semiconductor substrate 10. A bottom surface wiring 40, which is continuously and integrally formed with the through-hole electrode 30, is provided on the insulating film 21. That is, the bottom surface wiring 40 is made of the same material as the through-hole electrode 30 and is electrically connected to the through-hole electrode 30. The bottom surface wiring is a conductor wire interconnecting the through-hole electrode 30 and an external terminal 50 on the bottom surface of the semiconductor substrate 10. The bottom surface wiring 40 is arbitrarily patterned.

The barrier metal 31a made of, for example Ti, TaN, or TiN, and the underlying wire 41 made of, for example Cu, having a film thickness of 5 μm or more, are provided between the insulating film 20 and the insulating film 21 at the bottom surface of the semiconductor substrate 10. The underlying wire 41 and the through-hole electrode 30 are isolated from each other by the insulating film 21. Also, the through-hole electrode 30 and the semiconductor substrate 10 are isolated from each other by the insulating film 21. The underlying wire 41 and the semiconductor substrate 10 are isolated from each other by the insulating film 20. An opening is provided in a portion, corresponding to the external terminal 50, of the insulating film 21. The bottom surface wiring 40 is connected to the underlying wire 41 through the opening of the insulating film 21. At a connection part between the bottom surface wiring 40 and the underlying wire 41, the substantial film thickness of the bottom surface wiring 40 can be considered as equal to the sum of the film thickness of the underlying wire 41 and the film thickness of the bottom surface wiring 40. Consequently, it is possible to secure a sufficient film thickness at a portion, to which the external terminal 50 is connected, of the bottom surface wiring 40.

The bottom surface of the semiconductor substrate 10 is covered with an insulating film 60, such as a solder resist. An opening is provided in the insulating film 60. The external terminal 50 is connected to a portion, exposed through the opening, of the bottom surface wiring 40. The external terminal 50 is provided such that the connection part between the bottom surface wiring 40 and the underlying wire 41 is located immediately below the external terminal 50. The external terminal 50 is made of, for example, SnAg, SnAgCu, SnCu, SnZn, SnPb, AuSn, or the like. The external terminal 50 may be formed in the shape of a solder ball. A plurality of external terminals 50 are provided so as to correspond to the respective through-hole electrodes 30. The external terminals 50 are arranged on the bottom surface of the semiconductor substrate 10 in the form of a grid. The insulating film 60 prevents solder from leaking to the bottom surface wiring 40 during a reflow process carried out when the semiconductor device 2 is mounted on a mounting substrate. The external terminal 50 is electrically connected to the top surface electrode 15 via the bottom surface wiring 40 and the through-hole electrode 30. Consequently, it is possible to achieve transmission and reception of input and output signals at the bottom surface of the semiconductor substrate 10.

The film thickness of the bottom surface wiring 40 is approximately equal to the film thickness of the through-hole electrode 30. However, the bottom surface wiring 40 is connected to the underlying wire 41 at a portion, to which the external terminal 50 is connected, of the bottom surface wiring 40, and therefore, the bottom surface wiring 40 has a substantial film thickness of 7 μm or more. Consequently, the bottom surface wiring 40 located immediately below the external terminal 50 is substantially thick, and therefore, it is possible to prevent separation of the bottom surface wiring 40 even when metal (for example, Cu) constituting the bottom surface wiring and metal (for example, SnAg) constituting the external terminal 50 are diffused into each other. In the structure of the semiconductor device 2 according to the second embodiment of the present invention, it is possible to set the film thickness of the through-hole electrode 30 independently of the film thickness of the bottom surface wiring 40. Also, the film thickness of the through-hole electrode 30 is set such that the through-hole electrode 30 is not affected by thermal stress. That is, it is possible to simultaneously prevent separation of the through-hole electrode and separation of the bottom surface wiring in the semiconductor device having the through-hole electrode and the bottom surface wiring which are integrally formed.

Next, a manufacturing method of the semiconductor device 2 having the above-described structure will be described. FIGS. 7A to 9C are cross-sectional views respectively showing process steps of a manufacturing method of the semiconductor device 2 according to the second embodiment of the present invention.

Figure 7A:
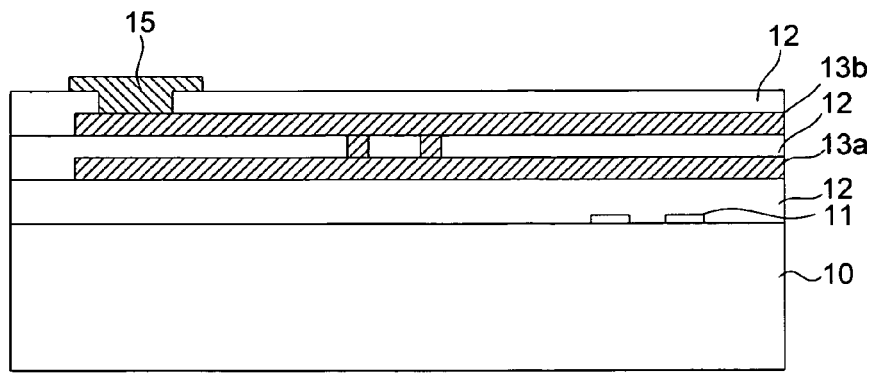
FIGS. 7A to 7D are cross-sectional views showing a manufacturing method of the semiconductor device according to the second embodiment of the present invention.

First, a well-known image sensor chip manufacturing method, including a CMOS circuit and light receiving element forming process, a wiring layer forming process, and a surface electrode forming process, is carried out to prepare a semiconductor substrate 10 (FIG. 7A).

Figure 7B:
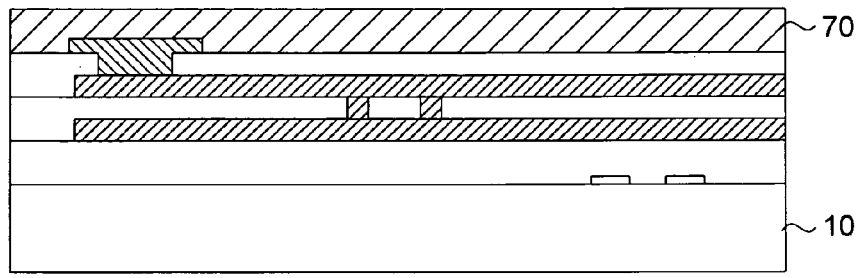

Subsequently, a support member 70, such as a transparent tape or a glass substrate, is joined to an circuit element forming surface of the semiconductor substrate 10. Next, a grinding process using a grinder or a CMP process is carried out to grind the semiconductor substrate 10 from the bottom surface thereof such that the semiconductor substrate 10 has a thickness of, for example, approximately 100 μm (FIG. 7B).

Figure 7C:
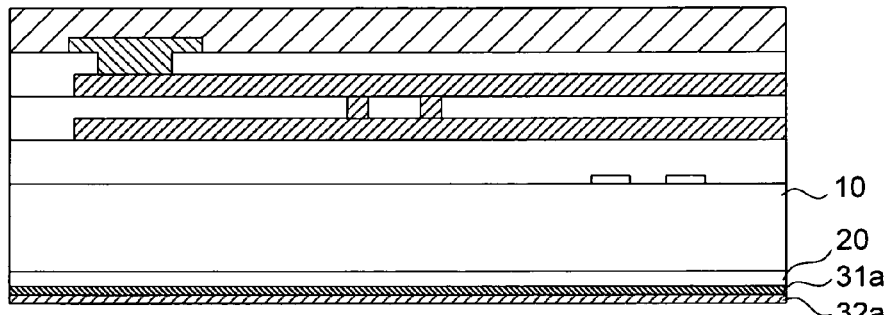

Next, a insulating film 20 made of, for example, a silicon oxide film ($SiO_2$), is formed at the bottom surface of the semiconductor substrate 10. The insulating film 20 may be formed through a CVD method using a mixture of silane gas ($SiH_4$) and oxygen gas ($O_2$) as a raw material gas. Meanwhile, the material for the insulating film 20 is not limited to the silicon oxide film ($SiO_2$). For example, the insulating film 20 may be made of a silicon nitride film ($Si_3N_4$). In this case, a mixture of silane gas ($SiH_4$) and ammonia gas ($NH_3$) is used as a raw material gas (FIG. 4A). Next, a barrier metal 31a, made of Ti, TaN, or TiN, is formed on the insulating film 20 using a sputtering method or a CVD method. The barrier metal 31a prevents a material, Cu, for an underlying wire 41 from being diffused into the semiconductor substrate 10. Next, a plating seed layer 32a, made of Cu, having a film thickness of 1 μm or less is formed on the barrier metal 31a using a sputtering method or a CVD method. Meanwhile, a collimated sputtering method may be used to form the barrier metal 31a and the plating seed layer 32a (FIG. 7C).

Figure 7D:
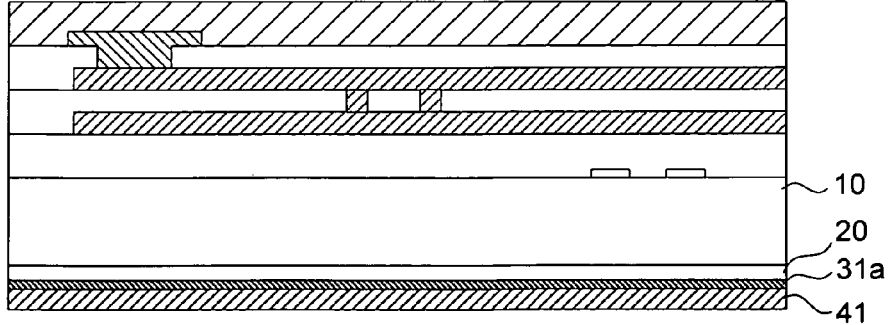

Next, a conductive film, made of Cu, is formed on the plating seed layer 32a using an electroplating method to form an underlying wire 41, having a film thickness of 5 μm or more, over the bottom surface of the semiconductor substrate 10. In the electroplating process, an electrode is attached to the plating seed layer 32a, and the semiconductor substrate is deposited in a plating solution, whereby the conductive film is formed on the plating seed layer 32a (FIG. 7D).

Figure 8A:
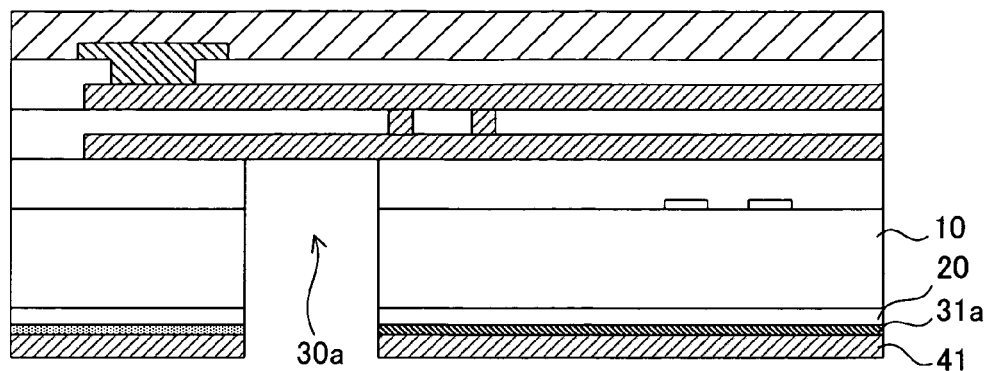
FIGS. 8A to 8C are cross-sectional views showing a manufacturing method of the semiconductor device according to the second embodiment of the present invention.

Next, a resist is applied to the bottom surface of the semiconductor substrate 10, and an exposure process and a development process are carried out to form a resist mask (not shown) having an opening formed at a region corresponding to a through-hole electrode forming part. Next, the underlying wire 41, the barrier metal 32a, the insulating film 20, the semiconductor substrate 10 and an interlayer insulating film 12 are sequentially etched, using a dry etching method or a wet etching method, to form a cylindrical through hole 30a, having a diameter of 30 μm or more, extending to a wiring layer 13a (FIG. 8A).

Figure 8B:
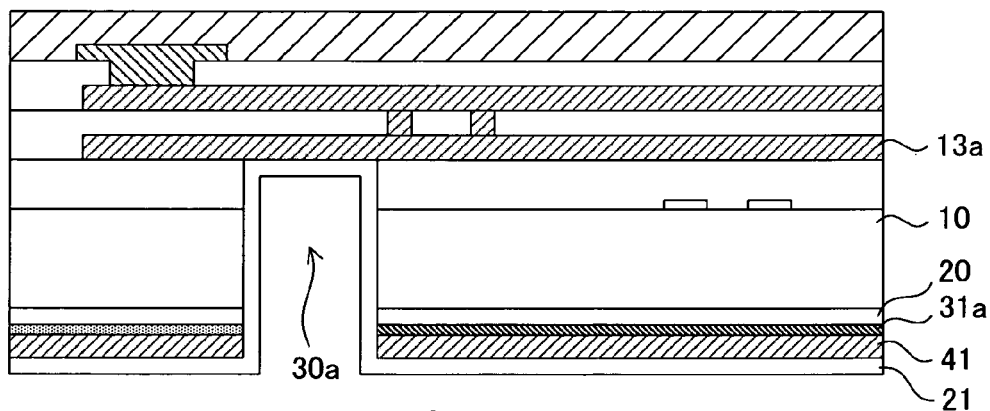

Next, the resist mask is removed, and a photosensitive insulating resin is applied to cover the underlying wire 41 on the bottom surface of the semiconductor substrate 10 and the inner side and the inner bottom of the through hole 30a using a spin coating method or a spraying method. The photosensitive insulating resin is cured to form a insulating film 21 having a film thickness of approximately 1 to 3 μm. Meanwhile, the insulating film 21 may be an $SiO_2$ film or an $Si_2N_4$ film formed using a CVD method (FIG. 8B).

Figure 8C:
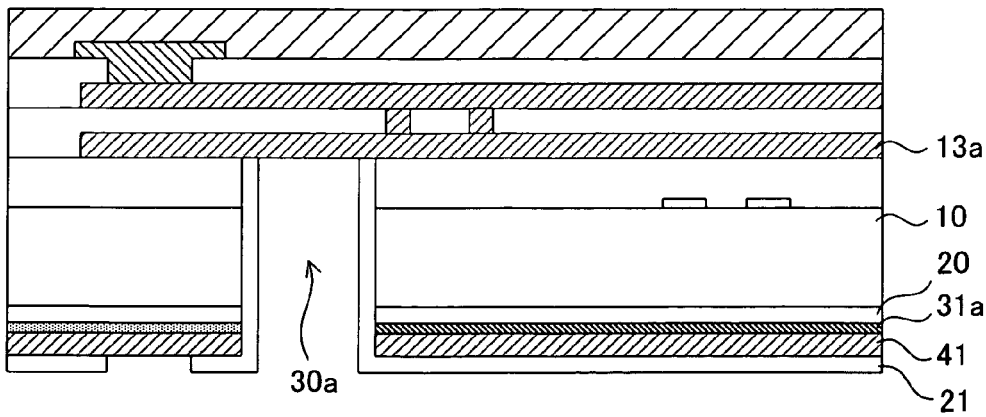

Next, the insulating film 21, made of the photosensitive insulating resin, is selectively exposed and developed to selectively remove the insulating film 21 from the bottom of the through hole 30a and the external terminal forming part. As a result, the wiring layer 13a is exposed at the bottom of the through hole 30a, and, at the same time, the underlying wire 41 is exposed at the external terminal forming part of the bottom surface of the semiconductor substrate 10. The insulating film 21 remains on the inner side of the through hole 30a and other portions of the bottom surface of the semiconductor substrate 10 (FIG. 8C).

Figure 9A:
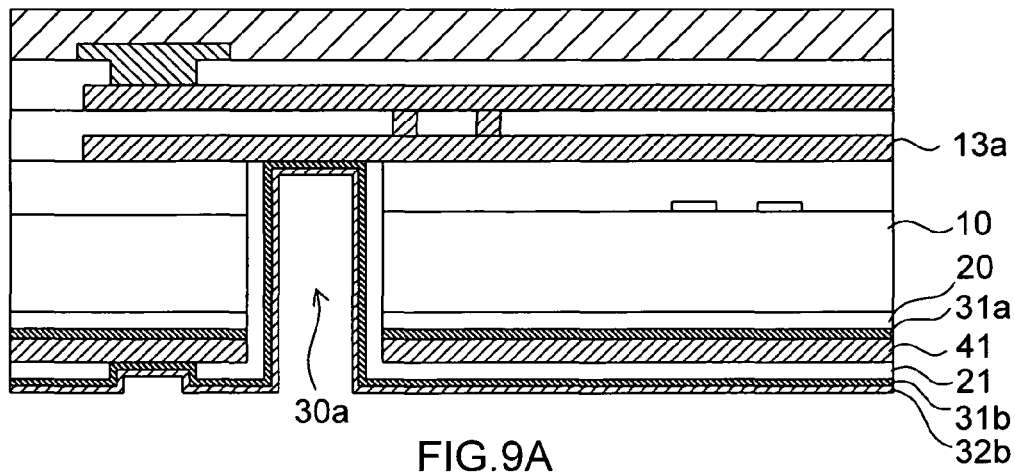
FIGS. 9A to 9C are cross-sectional views showing a manufacturing method of the semiconductor device according to the second embodiment of the present invention.

Next, a barrier metal 31b made of, for example, Ti, TaN, or TiN is formed to cover the inner side and the inner bottom of the through hole 30a and the bottom surface of the semiconductor substrate 10 using a collimated sputtering method or a CVD method exhibiting a high coverage property with respect to the interior of the through hole 30a. The barrier metal 31b prevents a material, Cu, for a through-hole electrode 30 and a bottom surface wiring 40 from being diffused into the semiconductor substrate 10. Next, a plating seed layer 32b, made of Cu, having a film thickness of 1 μm or less is formed on the barrier metal 31b using a collimated sputtering method or a CVD method. The barrier metal 31b and the plating seed layer 32b are connected to the wiring layer 13a at the bottom of the through hole 30a and, at the same time, are connected to the underlying wire 41 at the external terminal forming part at the bottom surface of the semiconductor substrate 10 (FIG. 9A).

Figure 9B:
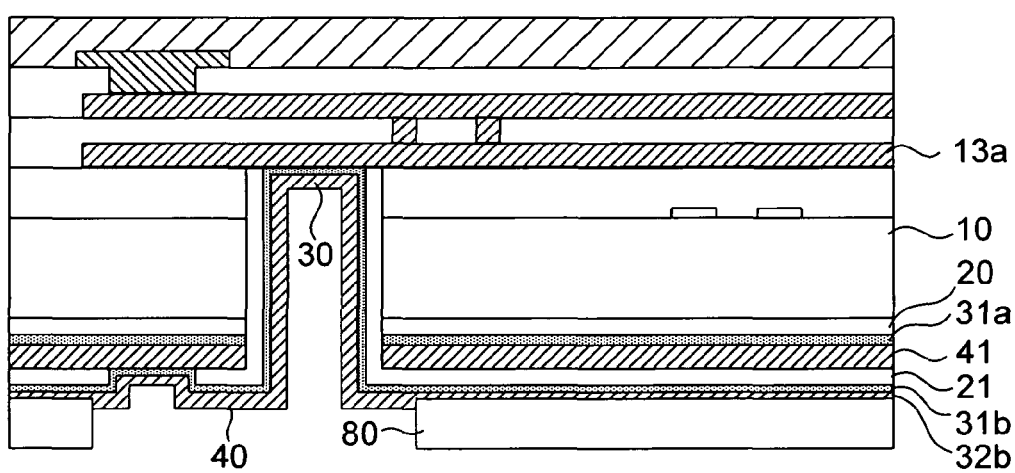

Next, a resist mask 80 corresponding to a pattern of a bottom surface wiring 40 is formed at the bottom surface of the semiconductor substrate 10. The resist mask 80 has an opening formed at a portion corresponding to a through hole forming part and a bottom surface wiring forming part. Next, a conductive film, made of Cu, is formed on the plating seed film 32b exposed through the opening of the resist mask 80 using an electroplating method. In the electroplating process, an electrode is attached to the plating seed layer 32b, and the semiconductor substrate is deposited in a plating solution, whereby the conductive film is formed on the plating seed layer 32b. As a result, a through-hole electrode 30 is formed to cover the inner side and the inner bottom of the through hole 30a, and a bottom surface wiring 40, connected to the through-hole electrode 30, is formed at the bottom surface of the semiconductor substrate 10. The conductive film has a film thickness (for example, 2 to 4 μm) with which separation of the through-hole electrode 30 due to thermal stress does not occur. Since the bottom surface wiring 40 is formed simultaneously with the through-hole electrode 30 through the plating process, the film thickness of the bottom surface wiring 40 is equal to the film thickness of the through-hole electrode 30. The bottom surface wiring 40 is connected to the underlying wire 41 via the barrier metal 31a at the external terminal forming region (FIG. 9B).

Figure 9C:
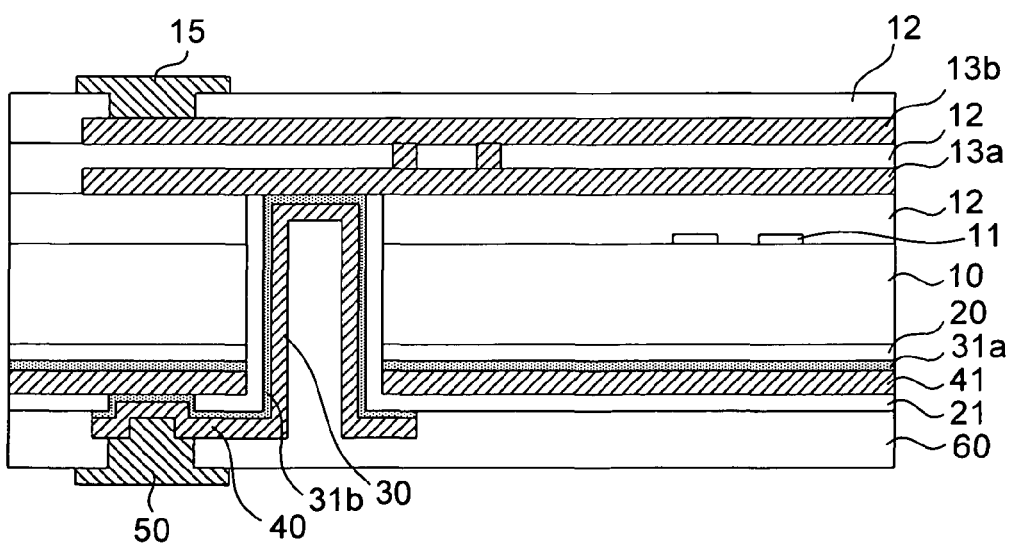

Next, the resist mask 80 is removed, and the plating seed layer 32b and the barrier metal 31b are removed from a portion which does not constitute the bottom surface wiring 40 on the bottom surface of the semiconductor substrate 10 using a dry etching method or a wet etching method. Meanwhile, the barrier metal 31b and the plating seed layer 32b may be patterned using a lift-off method at the steps of forming the barrier metal 31b and the plating seed layer 32b. In this case, etching of the plating seed layer 32b and the barrier metal 31b may be omitted. Next, a photosensitive solder resist is applied to cover the bottom surface wiring 40. The photosensitive solder resist is selectively exposed and cured to form a insulating film having an opening formed at the external terminal forming part. The inner space of the through hole 30a is filled with the insulating film 60. The opening of the insulating film 60 is provided on the connection part between the bottom surface wiring 40 and the underlying wire 41. Next, flux is applied to the bottom surface wiring 40 exposed through the opening of the insulating film 60. A solder ball, made of SnAg, is mounted on the connection part between the bottom surface wiring 40 and the underlying wire 41 using a mask, and a reflow process is carried out to form an external terminal 50 on the bottom surface wiring 40. Meanwhile, the solder ball may be made of SnAgCu, SnCu, SnZn, SnPb, AuSn, or the like. Subsequently, the support member 70 attached to the circuit element forming surface of the semiconductor substrate 10 is removed. A semiconductor device 2 is manufactured through the respective processes as described above. Meanwhile, the semiconductor device 2 may be cut into pieces using a dicing method, and the pieces of the semiconductor device 2 may be stacked, as needed (FIG. 9C).

That is to say, in accordance with another aspect of the present invention, there is provided a manufacturing method of a semiconductor device including the steps of forming a wiring layer above a semiconductor substrate, forming a first insulating film at the bottom surface of the semiconductor substrate, forming a first conductive film on the first insulating film, forming a through hole extending from the first conductive film to the wiring layer, forming a second insulating film to cover an inner side and an inner bottom of the through hole and the first conductive film, partially removing the second insulating film to expose the wiring layer at the bottom of the through hole and to expose a portion of the first conductive film at the bottom surface of the semiconductor substrate, forming a second conductive film to cover the inner side and the inner bottom of the through hole and the second insulating film so as to form a through-hole electrode extending from the bottom surface of the semiconductor substrate to the wiring layer and to form a bottom surface wire, constituted by the first and second conductive films, on the bottom surface of the semiconductor substrate such that a portion of the second conductive film is connected to the first conductive film, and forming an external terminal at a portion of the bottom surface wire corresponding to a connection part between the first conductive film and the second conductive film.

In the semiconductor device according to the second embodiment and the manufacturing method of the same, as described above, the bottom surface wiring 40 is integrally formed with the through-hole electrode 30, and the underlying wire 41 is connected to the portion, to which the external terminal 50 is joined, of the bottom surface wiring 40. Consequently, the film thickness of the bottom surface wiring 40 is substantially large at the part where the external terminal 50 is joined to the bottom surface wiring 40. Given this structure, it is possible to increase the film thickness of the bottom surface wiring 40 without affecting the film thickness of the through-hole electrode 30. Consequently, the film thickness of the through-hole electrode 30 is restricted such that separation of the through-hole electrode due to thermal stress does not occur. On the other hand, the film thickness of the bottom surface wiring 40 is sufficiently secured such that separation of the bottom surface wiring due to metal diffusion between the bottom surface wiring 40 and the external terminal 50 does not occur. That is, in the semiconductor device according to the second embodiment and the manufacturing method of the same, the film thickness of the through-hole electrode and the film thickness of the bottom surface wiring are controlled independently, and therefore, it is possible to simultaneously prevent separation of the through-hole electrode and separation of the bottom surface wiring.

Figure 10:
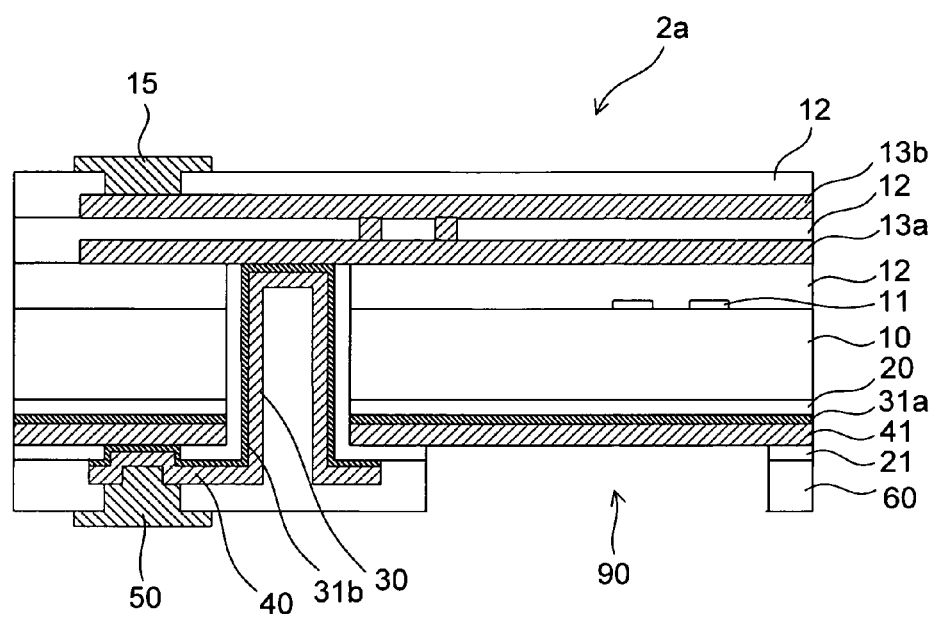
FIG. 10 is a cross-sectional view showing the construction of a semiconductor device according to a modification of the second embodiment of the present invention.

FIG. 10 is a cross-sectional view of a semiconductor device 2a, which is a modification of the semiconductor device 2 according to the second embodiment of the present invention. In the semiconductor device 2a, a insulating film 60 and a insulating film 21 formed on a bottom surface of a semiconductor substrate 10 are etched to form an opening 90, and an underlying wire 41 is exposed through the opening 90. As a result, heat dissipation of the semiconductor device 2a is improved. In a case in which a portion having a floating potential of the underlying wire 41 is exposed, as shown in FIG. 10, malfunction due to introduction of noise does not occur.

Third Embodiment

Figure 11:
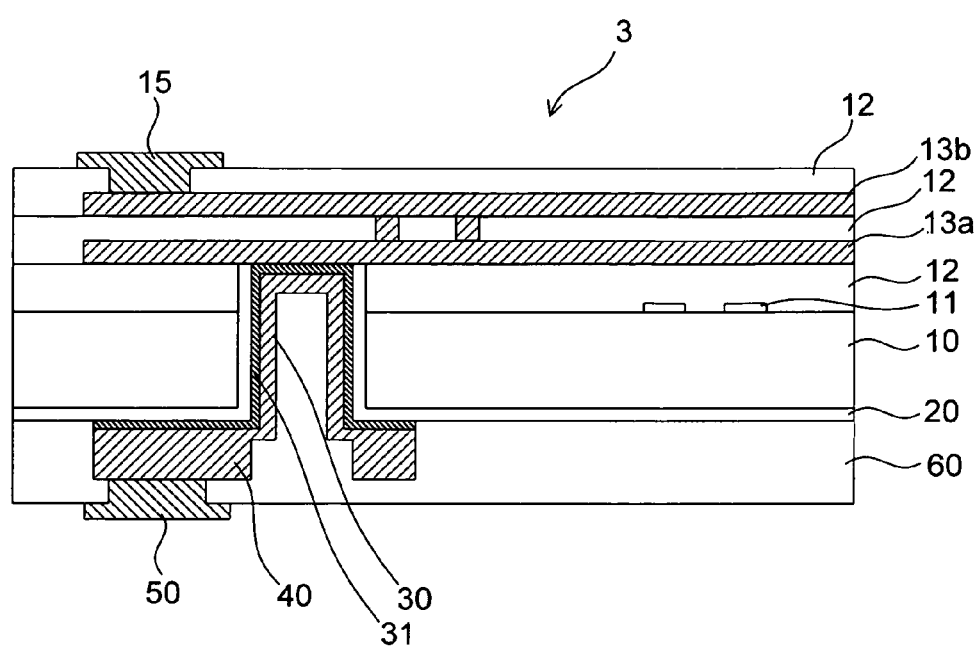
FIG. 11 is a cross-sectional view showing the construction of a semiconductor device according to a third embodiment of the present invention.

FIG. 11 is a cross-sectional view showing the structure of a semiconductor device 3 according to a third embodiment of the present invention. Specifically, FIG. 11 shows a through-hole electrode forming part of the semiconductor device 3. The semiconductor device 3 constitutes an image sensor in the same manner as the semiconductor device 1 according to the first embodiment. Also, the semiconductor device 3 has the same structure as the semiconductor device 1. In the semiconductor device 1, the bottom surface wiring 40 has a large film thickness only immediately below the external terminal 50. In the semiconductor device 3 according to the third embodiment, on the other hand, the whole bottom surface wiring 40 has a greater film thickness than the film thickness of the through-hole electrode 30. The semiconductor device 3 is identical in other components to the semiconductor device 1, and therefore, a description thereof will not be given.

Next, a manufacturing method of the semiconductor device 3 having the above-described structure will be described. FIGS. 12A to 13C are cross-sectional views respectively showing process steps of a manufacturing method of the semiconductor device 3 according to the third embodiment of the present invention. Meanwhile, the manufacturing method of the semiconductor device 3 is identical to the manufacturing method of the semiconductor device 1 in terms of the processes shown in FIG. 3A to FIG. 4C, i.e., the first process to the process of forming the barrier metal and the plating seed layer to cover the inner wall of the through hole 30a and the bottom surface of the semiconductor substrate 10, and therefore, a description thereof will not be given.

Figure 12A:
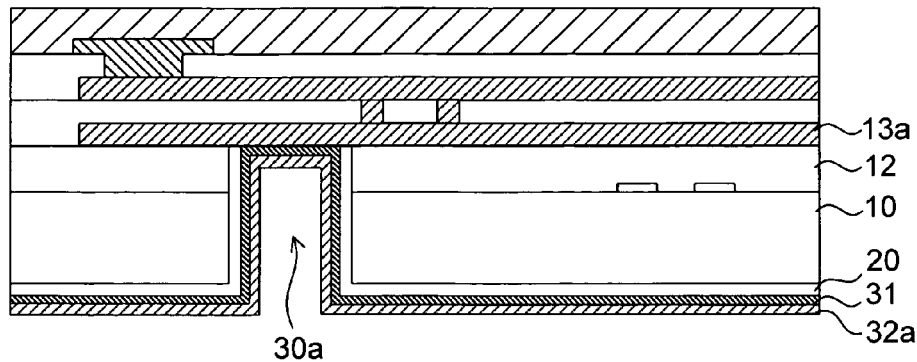
FIGS. 12A to 12C are cross-sectional views showing a manufacturing method of the semiconductor device according to the third embodiment of the present invention.

A through hole 30a is formed in a semiconductor substrate 10, a insulating film 20 is formed to cover the inner side and the inner bottom of the through hole 30a and the bottom surface of the semiconductor substrate 10, and the insulating film 20 is removed from the bottom of the through hole 30a. After that, a barrier metal 31a and a plating seed layer 32a are formed to cover the inner wall of the through hole 30a and the bottom surface of the semiconductor substrate 10 (FIG. 12A). At this time, the barrier metal 31a is formed using a collimated sputtering method or a CVD method exhibiting a high coverage property with respect to the interior of the through hole 30a. Preferably, the plating seed layer 32a is formed using a normal sputtering method having a lower coverage property than the collimated sputtering methods with respect to the interior of the through hole 30a.

Figure 12B:
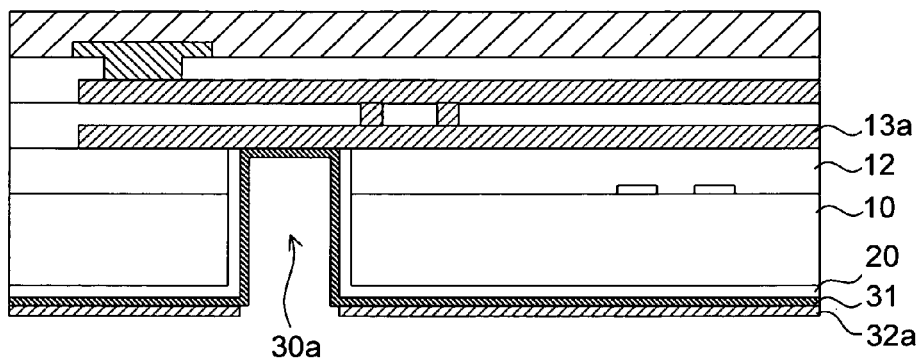

Next, a resist mask (not shown) having an opening formed at a portion corresponding to a through hole forming part is formed on the bottom surface of the semiconductor substrate 10. After that, only the plating seed layer 32a formed at the inner side and the bottom of the through hole 30a is removed through a wet etching process using a mixture of potassium hydrogen sulfate and potassium peroxodisulfate exhibiting high selectivity to the barrier metal. The plating seed layer 32a remains on the bottom surface of the semiconductor substrate 10 (FIG. 12B).

Figure 12C:
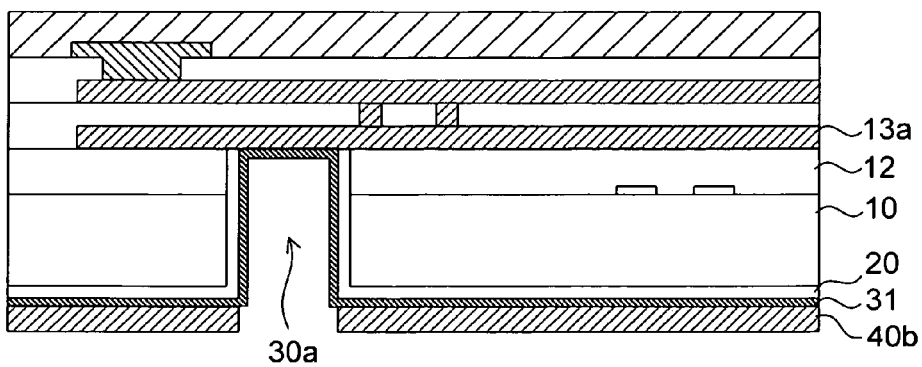

Next, a conductive film, made of Cu, is formed on the plating seed layer 32a on the bottom surface of the semiconductor substrate 10, using an electroplating method, so as to a form a lower layer part 40b of a bottom surface wiring having a film thickness of approximately 3 μm (FIG. 12C).

Figure 13A:
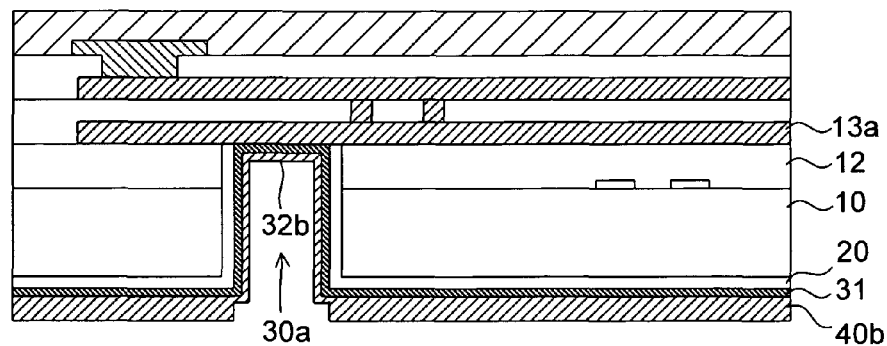
FIGS. 13A to 13C are cross-sectional views showing a manufacturing method of the semiconductor device according to the third embodiment of the present invention.

Next, a plating seed layer 32b, made of Cu, having a film thickness of 1 μm or less, is formed at the inner side and the inner bottom of the through hole 30a using a collimated sputtering method or a CVD method exhibiting a high coverage property with respect to the interior of the through hole 30a (FIG. 13A).

Figure 13B:
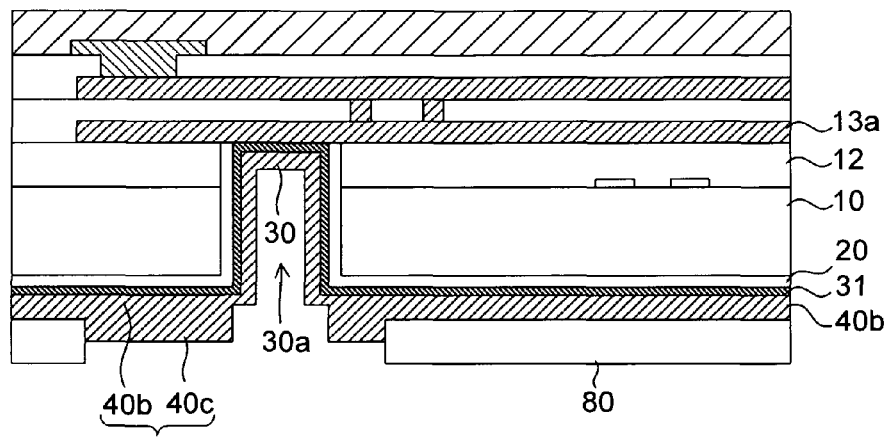

Next, a resist mask 80 corresponding to a pattern of a bottom surface wiring 40 is formed at the bottom surface of the semiconductor substrate 10. That is, the resist mask 80 has an opening formed at a portion corresponding to the through hole forming part and a bottom surface wiring forming part. Next, a conductive film, made of Cu, is formed on the plating seed layer 32b, inside the through hole 30a, exposed through the opening of the resist mask 80 and on the lower layer part 40b of the bottom surface wiring using an electroplating method. As a result, a through-hole electrode 30 is formed to cover the inner side and the inner bottom of the through hole 30a, and an upper layer part 40c is stacked on the lower layer part 40b of the bottom surface wiring at the bottom surface of the semiconductor substrate 10. The bottom surface wiring 40 includes the lower layer part 40b and the upper layer part 40c. The film thickness of the bottom surface wiring 40 is the sum (for example, 7 μm or more) of the film thickness of the lower layer part 40b and the film thickness of the upper layer part 40c. The through-hole electrode 30 has a film thickness (for example, 2 to 4 μm) at which separation of the through-hole electrode 30 due to thermal stress does not occur (FIG. 13B).

Figure 13C:
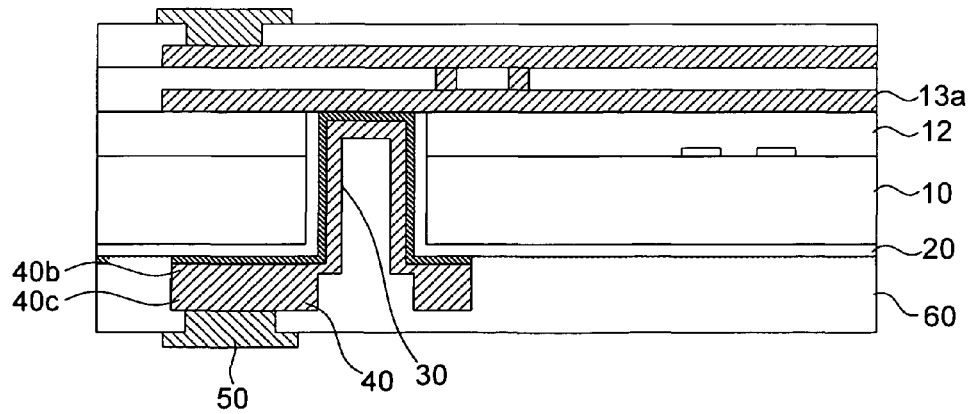

Next, the resist mask 80 is removed, and then an unnecessary portion of the conductive film which does not constitute the pattern of the bottom surface wiring 40 is removed from the bottom surface of the semiconductor substrate 10 using a dry etching method or a wet etching method. Next, a photosensitive solder resist is applied to cover the bottom surface wiring 40. The photosensitive solder resist is selectively exposed and cured to form a insulating film 60 having an opening formed at an external terminal forming part. The inner space of the through hole 30a is filled with the insulating film 60. Next, flux is applied to the bottom surface wiring 40 exposed through the opening of the insulating film 60. A solder ball, made of SnAg, is mounted on the exposed portion of the bottom surface wiring 40 using a mask, and a reflow process is carried out to form an external terminal 50 on the bottom surface wiring 40. Meanwhile, the solder ball may be made of SnAgCu, SnCu, SnZn, SnPb, AuSn, or the like. Subsequently, a support member 70 attached to a circuit element forming surface of the semiconductor substrate 10 is removed. A semiconductor device 3 is manufactured through the respective processes as described above. Meanwhile, the semiconductor device 3 may be cut into pieces using a dicing method, and the pieces of the semiconductor device 3 may be stacked, as needed (FIG. 13C).

In the semiconductor device according to the third embodiment and the manufacturing method of the same, as described above, the bottom surface wiring 40 is integrally formed with the through-hole electrode 30, and the whole bottom surface wiring 40 has a greater film thickness than the film thickness of the through-hole electrode 30. Since the film thickness of the bottom surface wiring 40 is adjusted by forming the lower layer part 40b before forming the through-hole electrode, it is possible to control the film thickness of the bottom surface wiring 40 independently of the film thickness of the through-hole electrode 30. Consequently, the film thickness of the through-hole electrode 30 is restricted such that separation of the through-hole electrode due to thermal stress does not occur. On the other hand, the film thickness of the bottom surface wiring 40 is sufficiently secured such that separation of the bottom surface wiring due to metal diffusion between the bottom surface wiring 40 and the external terminal 50 does not occur. In brief, in the semiconductor device according to the third embodiment and the manufacturing method of the same, the film thickness of the through-hole electrode and the film thickness of the bottom surface wiring are controlled independently, and therefore, it is possible to simultaneously prevent separation of the through-hole electrode and separation of the bottom surface wiring.

Figure 14:
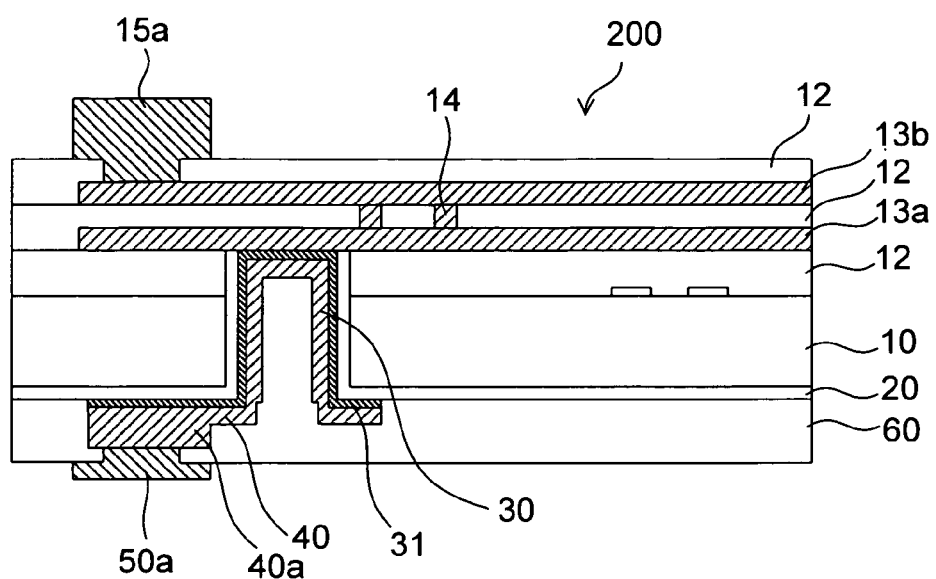
FIG. 14 is a cross-sectional view showing the construction of a dynamic random access memory (DRAM), which is an embodiment of the present invention.

Meanwhile, application of the present invention to an image sensor has been described with reference to the respective preferred embodiments of the present invention. However, the present invention is not limited to the embodiments as described above. The present invention may be applied to, for example, a stack type dynamic random access memory (DRAM) configured in a structure in which a plurality of DRAM cores is stacked. In this case, as shown in FIG. 14, an external terminal 15a, connected to a wiring layer 13b, is formed on the top surface of a DRAM core 200. An electrode pad 50a is formed at the bottom surface of the DRAM core 200. The external terminal 15a and the electrode pad 50a are connected to each other via a through-hole electrode 30. In the stack type DRAM, an electrode pad 50a of an upper DRAM core is joined to an external terminal 15a of a lower DRAM core.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

This application is based on Japanese Patent Application No. 2009-250749 which is herein incorporated by reference.

What is claimed is:

1. A semiconductor device comprising:
 a semiconductor substrate;
 a wiring layer formed above said semiconductor substrate;
 a through-hole electrode extending from a bottom surface of said semiconductor substrate to said wiring layer;
 a bottom surface wiring provided at the bottom surface of said semiconductor substrate such that said bottom surface wiring is connected to said through-hole electrode;
 an insulating film covering the bottom surface of said semiconductor substrate and said bottom surface wiring, the insulating film having an opening for a first portion of said bottom surface wiring; and
 an external terminal being connected to said bottom surface wiring at said first portion of said bottom surface wiring,
 wherein said first portion of said bottom surface wiring has a greater thickness than both of
  a thickness of a second portion of said bottom surface wiring, and
  a thickness of said through-hole electrode,
 wherein said external terminal extends from said first portion of said bottom surface wiring to a bottommost surface of said insulating film so as to be beneath the bottommost surface, and
 further wherein said external terminal covers all of said first portion.

2. The semiconductor device according to claim 1, wherein the film thickness of said bottom surface wiring is uniform.

3. The semiconductor device according to claim 1, wherein said bottom surface wiring comprises a plurality of layers, the layers of said bottom surface wiring are connected to each other at the portion of said bottom surface wiring including the connection part between said bottom surface wiring and said external terminal, and the layers of said bottom surface wiring are isolated from each other by a insulating film at other portions of said bottom surface wiring.

4. The semiconductor device of claim 1, wherein said first portion is formed of a same material as said second portion, and said first portion is formed integrally with said second portion.

5. The semiconductor device of claim 1, wherein said first and second portions are made of Cu, and said external terminal is made of SnAg.

6. The semiconductor device of claim 1, wherein a length of an uppermost surface of said external terminal is less than a length of a bottommost surface of the external terminal.

7. The semiconductor device of claim 6, wherein said uppermost surface of said external terminal touches said first portion, and said external terminal touches said bottommost surface of said insulating film.

8. The semiconductor device of claim 1, wherein the external terminal extends so as to have a portion disposed beneath all of the insulating film.

9. The semiconductor device of claim 1, wherein the external terminal is disposed within the insulating film.

10. The semiconductor device of claim 1, wherein the external terminal is separate from and not integral with all of the bottom surface wiring.

11. A semiconductor device comprising:
 a semiconductor substrate;
 a wiring layer formed above said semiconductor substrate;
 a through-hole electrode extending from a bottom surface of said semiconductor substrate to said wiring layer;
 a bottom surface wiring provided at the bottom surface of said semiconductor substrate such that said bottom surface wiring is connected to said through-hole electrode;
 an insulating film covering the bottom surface of said semiconductor substrate and said bottom surface wiring, the insulating film having an opening for a first portion of said bottom surface wiring; and
 an external terminal that is separate from and not integral with all of the bottom surface wiring, the external terminal having a first surface touching said first portion and a second surface opposite the first surface, the first surface having a smaller length than that of the second surface, the length of the second surface further being greater than that of the first portion, said external terminal extending from said first portion of said bottom surface wiring to a bottommost surface of said insulating film,
 wherein said first portion of said bottom surface wiring has a greater thickness than both of
  a thickness of a second portion of said bottom surface wiring, and
  a thickness of said through-hole electrode.

12. The semiconductor device of claim 11, wherein said first portion is formed of a same material as said second portion, and said first portion is formed integrally with said second portion.

13. The semiconductor device of claim 11, wherein said first and second portions are made of Cu, and said external terminal is made of SnAg.

14. The semiconductor device of claim 11, wherein the first surface is an uppermost surface of said external terminal and the second surface is a bottommost surface of the external terminal.

15. The semiconductor device of claim 14, wherein said external terminal touches said bottommost surface of said insulating film.

16. The semiconductor device of claim 11, wherein the external terminal extends so as to have a portion disposed beneath all of the insulating film.

17. The semiconductor device of claim 11, wherein the external terminal is disposed within the insulating film.

* * * * *